United States Patent
Qureshi et al.

(10) Patent No.: US 7,362,645 B2
(45) Date of Patent: Apr. 22, 2008

(54) INTEGRATED CIRCUIT FUSES HAVING CORRESPONDING STORAGE CIRCUITRY

(75) Inventors: Qadeer A. Qureshi, Dripping Springs, TX (US); John J. Vaglica, Austin, TX (US); William C. Moyer, Dripping Springs, TX (US); Ryan D. Bedwell, Provo, UT (US)

(73) Assignee: Freescale Semiconductor, Inc., Austin, TX (US)

( * ) Notice: Subject to any disclaimer, the term of this patent is extended or adjusted under 35 U.S.C. 154(b) by 685 days.

(21) Appl. No.: 10/955,356

(22) Filed: Sep. 30, 2004

(65) Prior Publication Data

US 2006/0085702 A1    Apr. 20, 2006

(51) Int. Cl.
G11C 17/18 (2006.01)
G11C 17/00 (2006.01)
G11C 7/10 (2006.01)
G11C 7/00 (2006.01)

(52) U.S. Cl. ............... 365/225.7; 365/96; 365/189.05; 365/196

(58) Field of Classification Search .................. 365/96, 365/225.7
See application file for complete search history.

(56) References Cited

U.S. PATENT DOCUMENTS

| | | | |
|---|---|---|---|
| 5,838,624 A * | 11/1998 | Pilling et al. ............. | 365/225.7 |
| 5,889,679 A | 3/1999 | Henry | |
| 6,161,188 A | 12/2000 | Gaskins | |
| 6,373,771 B1 * | 4/2002 | Fifield et al. ............. | 365/225.7 |
| 6,433,405 B1 | 8/2002 | Gunderson | |
| 6,469,949 B1 | 10/2002 | Hsu | |
| 6,680,873 B2 * | 1/2004 | Muraoka et al. ......... | 365/225.7 |
| 2002/0167855 A1 | 11/2002 | Hsu | |
| 2003/0117847 A1 * | 6/2003 | Makuta et al. ......... | 365/185.09 |
| 2005/0194674 A1 | 9/2005 | Thomas et al. | |
| 2006/0077215 A1 * | 4/2006 | Imanaka et al. ................ | 347/5 |

OTHER PUBLICATIONS

International Search Report issued on Oct. 29, 2007 in related PCT Application.
"Configuration and Modes of Operation," M68HC11 Reference Manual, Rev. 3, pp. 3-1 to 3-9.

* cited by examiner

Primary Examiner—Lý Duy Pham
(74) Attorney, Agent, or Firm—Susan C. Hill; Joanna G. Chiu

(57) ABSTRACT

Storage circuitry (66) may be used to store the values of fuses (77) so that storage circuitry (66) can be read instead of fuses (77). By accessing the fuse values from storage circuitry (66) rather than from fuses (77), there will be no sense current to fuses (77) that may cause marginal fuse blowage for fuses that have not yet been blown. This helps to prevent the situation in which an unblown fuse is erroneously read as having been blown. The use of storage circuitry (66) thus significantly improves the reliability of fuse module (20). For some embodiments, selection storage circuitry (64) may be used to determine whether storage circuitry (66) may be read or whether one of fuses (77) must be read in order to retrieve the desired current fuse value. The fuse value stored in storage circuitry (66) can also be used as direct hardware signals (80).

35 Claims, 3 Drawing Sheets

US 7,362,645 B2

INTEGRATED CIRCUIT FUSES HAVING CORRESPONDING STORAGE CIRCUITRY

FIELD OF THE INVENTION

The present invention relates generally to integrated circuit fuses, and more particularly to integrated circuit fuses having corresponding storage circuitry.

RELATED ART

Some integrated circuit fuses may have a sensitivity to repeated reads. For example, for fuses which are electrically blown and which are electrically sensed (sometimes called "efuses"), the sense current may cause marginal fuse blowage for fuses that have not yet been blown. This could eventually lead to an unblown fuse being erroneously read as having been blown. And unfortunately, the likelihood of such an erroneous read may increase as more reads are made to that unblown fuse.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 2:
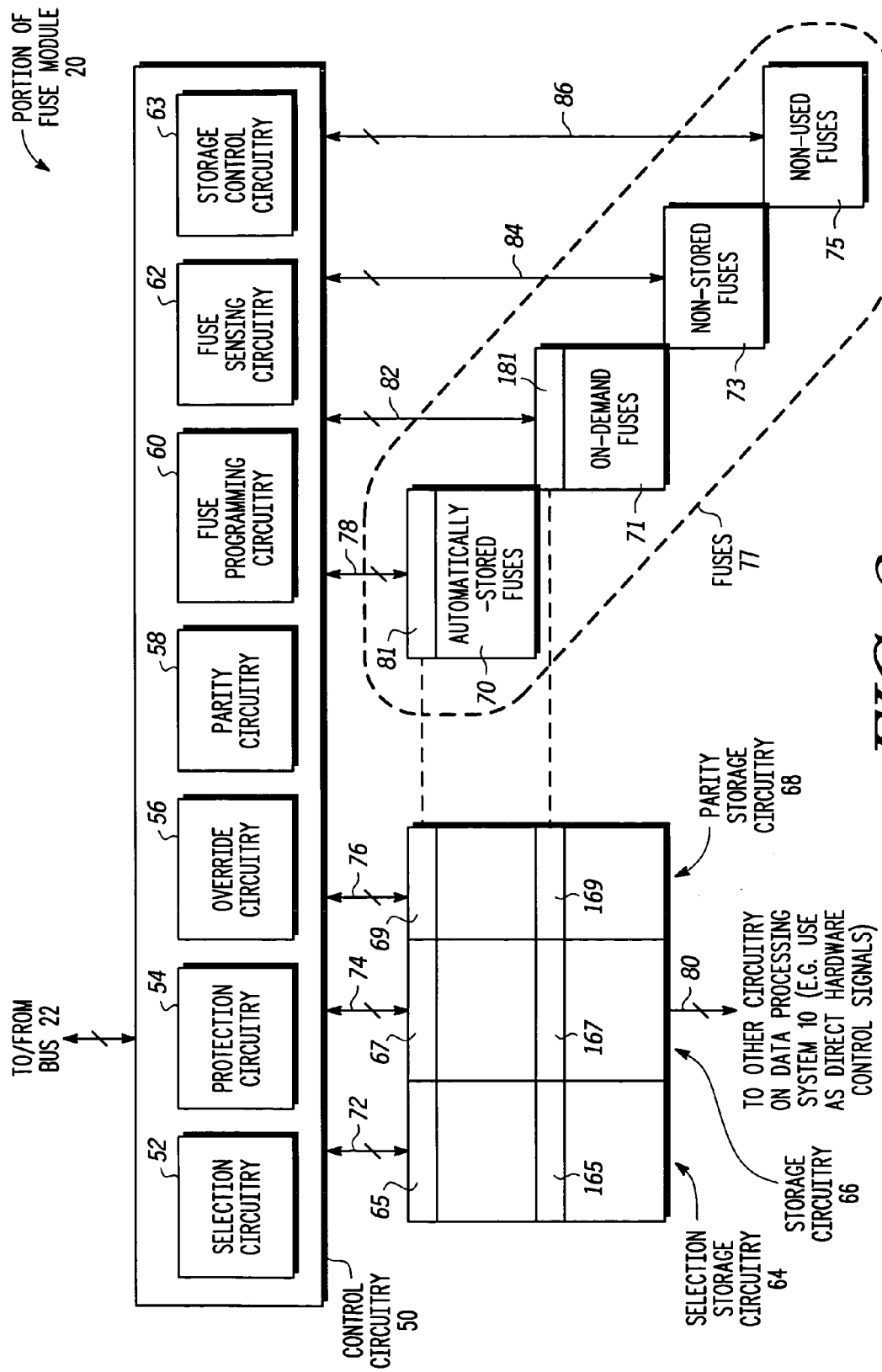
FIG. 2 illustrates, in block diagram form, a portion of a fuse module of FIG. 1 in accordance with one embodiment of the present invention.

Referring to FIG. 2, for some embodiments of the present invention, automatically-stored fuses 70 and on-demand fuses 71 are implemented as fuses which are electrically blown and which are electrically sensed. Thus, storage circuitry 66 may be used to store the value of fuses 70 and/or 71 so that storage circuitry 66 can be read instead of fuses 70 and/or 71. By accessing the fuse value from storage circuitry 66 rather than fuses 70 and/or 71, there will be no sense current to fuses 70 and/or 71 that may cause marginal fuse blowage for fuses that have not yet been blown. This helps to prevent the situation in which an unblown fuse is erroneously read as having been blown. And note that the likelihood of such an erroneous read may increase as more reads are made to the same unblown fuse. The use of storage circuitry 66 thus significantly improves the reliability of fuse module 20. For some embodiments of the present invention, selection storage circuitry 64 may be used to determine whether storage circuitry 66 may be read or whether one of fuses 70, 71 must be read in order to retrieve the desired current fuse value.

Figure 1:
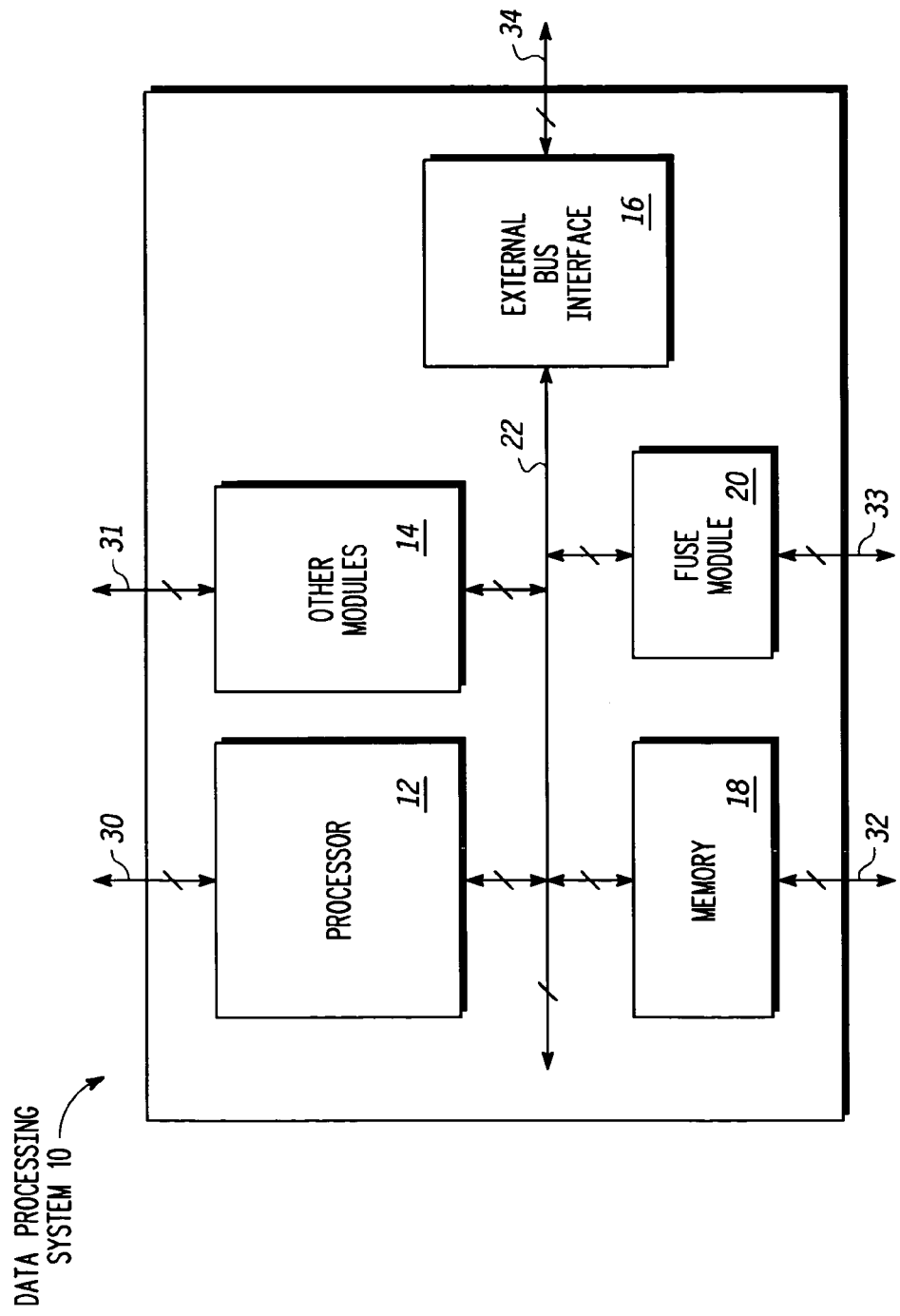
FIG. 1 illustrates, in block diagram form, a data processing system in accordance with one embodiment of the present invention.

FIG. 1 illustrates, in block diagram form, a data processing system 10 in accordance with one embodiment of the present invention. In one embodiment, data processing system 10 includes a processor 12, other modules 14, external bus interface 16, memory 18, and fuse module 20, all of which are bi-directionally coupled to bus 22. As used herein, the term "bus" is used to refer to a plurality of signals or conductors which may be used to transfer one or more various types of information, such as data, addresses, control, or status. Alternate embodiments may not include one or more of processor 12, other modules 14, external bus interface 16, and memory 18. Other modules 14, if present, may include any type of circuitry or module performing any type of function. Memory 18, if present, may include any type of circuitry which performs a storing or memory function. Processor 12, if present, may include any type of circuitry performing a processing function.

In some embodiments, processor 12 is bi-directionally coupled external to data processing system 10 by way of one or more integrated circuit terminals 30. In some embodiments, other modules 14 are bi-directionally coupled external to data processing system 10 by way of one or more integrated circuit terminals 31. In some embodiments, external bus interface 16 is bi-directionally coupled external to data processing system 10 by way of one or more integrated circuit terminals 34. In some embodiments, memory 18 is bi-directionally coupled external to data processing system 10 by way of one or more integrated circuit terminals 32. In some embodiments, fuse module 20 is bi-directionally coupled external to data processing system 10 by way of one or more integrated circuit terminals 33. In alternate embodiments, one or more of integrated circuit terminals 30-33 may not be present or may be uni-directional. Note that integrated circuit terminals 34 may be used to couple external bus interface 16 to an external bus (not shown). In some embodiments, read and/or write accesses to fuse module 20 may be received by fuse module 20 from any circuitry on data processing system 10, from any circuitry external to data processing system 10 by way of integrated circuit terminals 34, or from both.

FIG. 2 illustrates, in block diagram form, a portion of fuse module 20 of FIG. 1 in accordance with one embodiment of the present invention. In one embodiment, fuse module 20 includes control circuitry 50 which is bi-directionally coupled to bus 22. In one embodiment, fuse module 20 may receive read and/or write accesses to fuse module 20 by way of bus 22. In one embodiment, control circuitry 50 includes selection circuitry 52, protection circuitry 54, override circuitry 56, parity circuitry 58, fuse programming circuitry 60, fuse sensing circuitry 62, and storage control circuitry 63, as well as other control circuitry (not shown) which may be used to perform other standard fuse control functions.

In one embodiment, control circuitry 50 is bi-directionally coupled to selection storage circuitry 64 by way of one or more signals 72; control circuitry 50 is bi-directionally coupled to storage circuitry 66 by way of one or more signals 74; and control circuitry 50 is bi-directionally coupled to parity storage circuitry 68 by way of one or more signals 76. Alternate embodiments may not use parity, or may alternately use another error correction approach in addition to parity. In one embodiment, fuses 77 include automatically-stored fuses 70, on-demand fuses 71, non-stored fuses 73, and non-used fuses 75. Alternate embodiments may include any one or more types of fuses in fuses 77. Fuses 70, 71, 73, and 75 are just some example types of fuses that may be used in fuses 77.

In one embodiment, control circuitry 50 is bi-directionally coupled to automatically-stored fuses 70 by way of one or more signals 78; control circuitry 50 is bi-directionally coupled to on-demand fuses 71 by way of one or more signals 82; control circuitry 50 is bi-directionally coupled to non-stored fuses 73 by way of one or more signals 84; and control circuitry 50 is bi-directionally coupled to non-used fuses 75 by way of one or more signals 86. Alternate embodiments of fuse module 20 may include one or more types of fuses, including, but not limited to, automatically-stored fuses 70, on-demand fuses 71, non-stored fuses 73, and non-used fuses 75.

In some embodiments, storage circuitry, 66, may be coupled to other circuitry on data processing system 10 by way of one or more signals 80. In one embodiment, signals 80 may be used as direct hardware control signals to affect the behavior of other circuitry in data processing system 10. Note that it may be impossible to directly use fuses 77 to provide direct hardware control signals 80 to other circuitry on data processing system 10. Thus, the addition of storage circuitry 66 may allow the values from fuses 77 to be used as direct hardware control signals without requiring a sensing of fuses 77 that may degrade the reliability of fuses 77.

In one embodiment, circuit 65 in selection storage circuitry 64, circuit 67 in storage circuitry 66, and circuit 69 in parity storage circuitry 68 each correspond to a corresponding automatically-stored fuse 81 in automatically-stored fuses 70. In one embodiment, circuit 165 in selection storage circuitry 64, circuit 167 in storage circuitry 66, and circuit 169 in parity storage circuitry 68 each correspond to a corresponding on-demand fuse 181 in on-demand fuses 71.

Note that for one embodiment, selection storage circuitry 64 and parity storage circuitry 68 are updated each time that storage circuitry 66 is written with one or more fuses values from fuses 77 or bus 22. For some embodiments, selection storage circuitry 64 is invalidated any time that a parity error is detected. For some embodiments, selection storage circuitry 64 is also invalidated any time that a reset signal to fuse module 22 is asserted. Alternate embodiments may implement parity in a different manner, may combine one or more other error correction methods with parity, may use a different error correction method than parity, or may use no error correction at all.

In one embodiment, each one of automatically-stored fuses 70 has a fuse value that is always automatically sensed and stored into storage circuitry 66 upon detection of one or more predetermined events (e.g. detection of a reset condition, a power-on event, a periodic event (e.g. assertion of a timer signal), a write access, a predetermined software event, a predetermined hardware event, etc.). For one embodiment, any time that automatically-stored fuses 70 are sensed (e.g. fuses 81), the sensed values from fuses 70 are stored in a corresponding portion (e.g. storage circuit 67) of storage circuitry 66. In this case, a corresponding portion (e.g. selection storage circuit 65) of selection storage circuitry 64 may be used to indicate whether storage circuitry 66 should be read to retrieve the fuse value or whether the automatically-stored fuse 70 itself should be read. Subsequent read accesses to determine the value of fuses 70 may alternately access storage circuitry 66 and do not need to sense the actual value of fuses 70.

For some alternate embodiments, one or more automatically-stored fuses 70 may not require a corresponding selection storage circuitry 64. For example, if one or more automatically-stored fuses 70 is automatically stored in storage circuitry 66 as a result of reset, it will be appropriate to always access storage circuitry 66 to retrieve the correct value for these fuses 70. However, for some embodiments, it may simplify the functionality of control circuitry 50 if a selection storage circuit 65 is provided for each one of automatically-stored fuses 70, even if storage circuitry 66 will always contain the correct and current value of automatically-stored fuses 70. The use of selection storage circuitry 64 with automatically-stored fuses 70 allows control circuitry 50 to treat automatically-stored fuses 70 and on-demand fuses 71 in the same or similar manner.

In one embodiment, each one of on-demand fuses 71 has a fuse value that is selectively read only upon demand, where the demand can occur at any desired time and is not required to be a result of one or more predetermined events. In an alternate embodiment, control circuitry 50 is used to sense the values of at least a portion of automatically stored fuses 70 and on-demand fuses 71 over a period of time. One or more triggering events are used to cause storage circuitry 66 to become filled with fuse values over time, but preferably prior to the first request for use. At the point at which a fuse value is first needed, it is either already valid in the storage circuitry 66, or it is retrieved on demand. As time goes on, additional fuse values are periodically retrieved based on the one or more triggering events. The triggering event may be based on a period of time, a system event within data processing system 10, an access of another fuse within fuse module 20, an idle cycle on the bus 22 or external interface 36, an idle state or interval within a block of logic in processor 12 or other modules 14, a low power state within processor 12 or other modules 14, an access of a particular location or peripheral register within memory 18 or other modules 14, an interval where sufficient current is available for sensing fuses within fuse module 20, as well as other system events. This embodiment allows the cumulative delay of sensing multiple fuse values to be spread over time and allow for better system responsiveness. In this embodiment, the inherent delay in sensing multiple fuse values may be shorter or may be totally hidden.

In one embodiment, automatically-stored fuses 70 are implemented as fuses that are available only directly to the hardware and are not software-visible (e.g. cannot be read or written using software). And for some embodiments of the present invention, on-demand fuses 71 are implemented as fuses that are software-visible (e.g. can be read or written using software).

In one embodiment, non-stored fuses 73 are implemented as fuses that do not have a corresponding storage circuit in storage circuitry 66, and may not have corresponding storage circuit in selection storage circuitry 64. Thus, for the illustrated embodiment, non-stored fuses 73 must be read directly in order to determine the fuse value. In one embodiment, non-used fuses 75 are fuses that are implemented on data processing system 10 for future use, but are not currently being used (i.e. read and/or written). It is common for the number of total fuses 77 to be a power of two (e.g. 256 fuses). However, if only 250 fuses are required in a particular application using data processing system 10, there may be 6 fuses which are in the non-used fuses 75 category.

In one embodiment, each bit in fuses 70 and 71 has a corresponding bit is storage circuitry 66. Fuses 73 and 75 do not require, but may have, a corresponding bit in storage circuitry 66. Note that for the present invention, fuses 70, 71, 73, and 75 may be partitioned and addressable in any desirable manner. This partitioning and addressing may be different for read accesses to fuses 77 than for write (programming) accesses to fuses 77. For example, in one embodiment, each of fuses 70, 71, 73, and 75 are accessed on a byte (i.e. 8-bit) basis for read accesses, but are individually accessed for programming accesses. Note that each partitioned portion 81 (e.g. a byte for this embodiment) in fuses 70 has a corresponding storage circuit 67 in storage circuitry 66, a corresponding selection storage circuit 65 in selection storage circuitry 64 and a corresponding parity storage circuit 69 in parity storage circuitry 68. In one embodiment of the present invention, each corresponding storage circuit 67 has eight bits, each corresponding selection storage circuit 65 has one bit, and each corresponding parity storage circuit 69 has one bit for each corresponding byte 81 in fuses 70.

Similarly, each partitioned portion 181 (e.g. a byte for this embodiment) in fuses 71 has a corresponding storage circuit 167 in storage circuitry 66, a corresponding selection storage circuit 165 in selection storage circuitry 64 and a corresponding parity storage circuit 169 in parity storage circuitry 68. In one embodiment of the present invention, each corresponding storage circuit 167 has eight bits, each corresponding selection storage circuit 165 has one bit, and each corresponding parity storage circuit 169 has one bit for each corresponding byte 181 in fuses 71. In one embodiment, fuses 73 and 75 do not require, but may have, corresponding storage circuitry 66, corresponding selection storage circuitry 64, and corresponding parity storage circuitry 68.

Alternate embodiments may partition fuses 70 on a bit, byte (8-bits), word (16-bits), long word (32-bits), or any other desired boundary. This partitioning boundary can be used to determine how many of fuses 70 are mapped to each corresponding storage circuit 67. Similarly, alternate embodiments may partition fuses 71 on a bit, byte, word, long word, or any other desired boundary. This partitioning boundary can be used to determine how many of fuses 71 are mapped to each corresponding storage circuit 167. For example, if fuses 70 are partitioned on a word boundary, each corresponding storage circuit 67 has sixteen bits, each corresponding selection storage circuit 65 has one bit, and each corresponding parity storage circuit 69 has one bit for each corresponding word in fuses 70. Alternate embodiments of the present invention may use more bits in selection storage circuit 65 and 165, and in parity storage circuit 67 and 167. Note that some embodiments may not use parity at all, and thus parity storage circuitry 66 and parity circuitry 58 are not required. Also, other forms of error checking may be used instead of or in addition to parity.

Selection circuitry 52 determines, based on the value stored in the corresponding selection storage circuitry 165, whether the corresponding storage circuitry 167 is accessed or the fuse circuitry 181 is sensed to provide a read value on bus 22 in response to a read access to fuse 181. Selection circuitry 52 also determines, based on the value stored in the corresponding selection storage circuitry 65, whether the corresponding storage circuitry 67 is accessed or the fuse circuitry 81 is sensed to provide a read value on bus 22 in response to a read access to fuse 81. For one embodiment, the selection circuitry 52 treats automatically-stored fuses 70 and on-demand fuses 71 in the same manner. In this embodiment, the value stored in selection storage circuitry 64 is used by selection circuitry 52 to determine whether the corresponding storage circuitry 66 or the fuse circuitry 70, 71 is used to provide a read value on bus 22. Alternately, the functionality of selection storage circuitry 64 and selection circuitry 52 may be partitioned in any desired manner.

In an alternate embodiment, selection circuitry 52 may include a decoder which uses the read access address to determine whether the read access is to fuses 70, 71, or 73, and even to which portion of these fuses. Selection circuitry 52 can then decide, based on the address, and thus the output of the decoder, whether to use the value stored in storage circuitry 66 as the fuse value or whether the fuse itself must be sensed. For this alternative, selection storage circuitry 64 may not be required.

Figure 3:
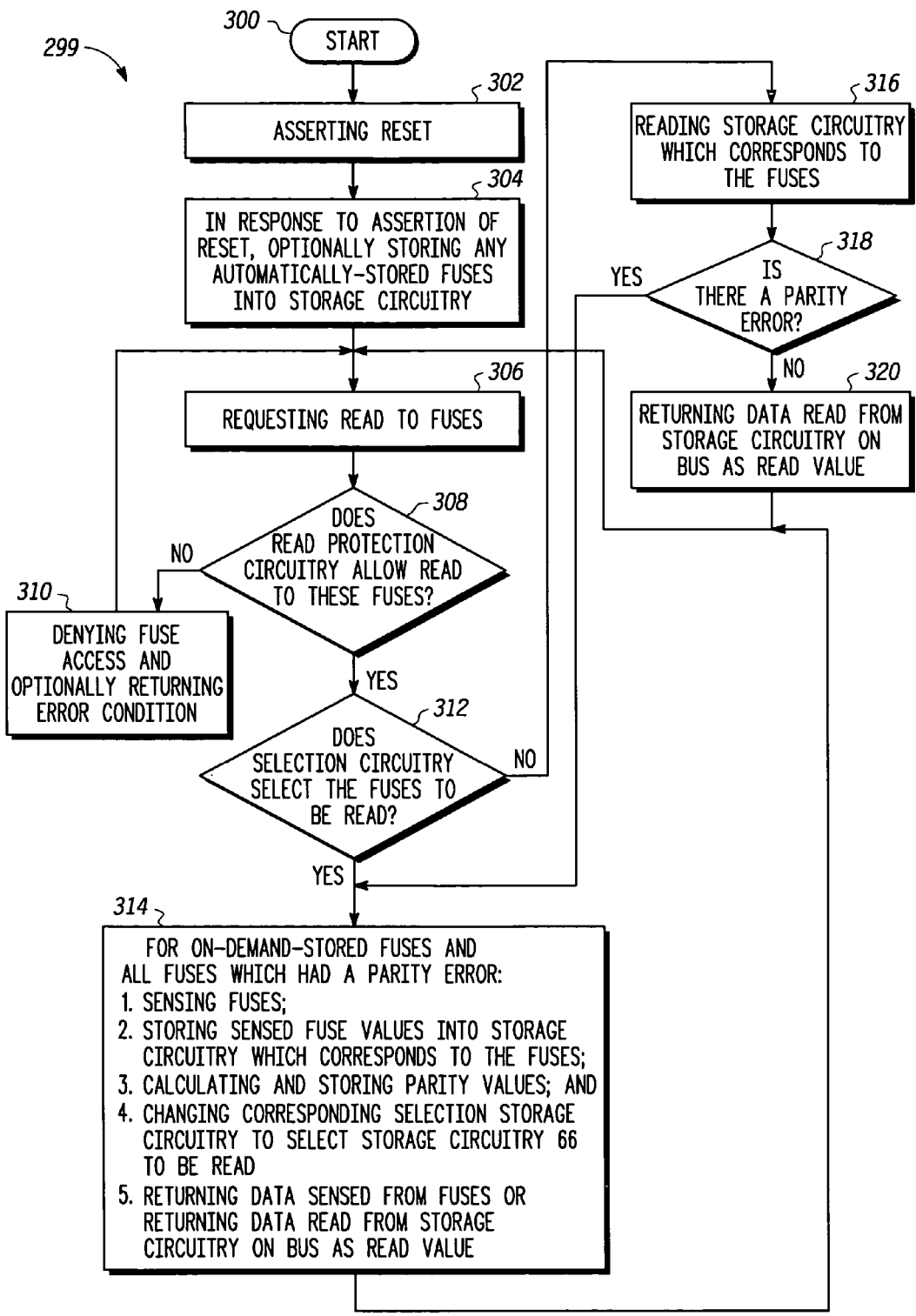
FIG. 3 illustrates, in flow diagram form, a method for using fuses in accordance with one embodiment of the present invention.

In one embodiment, protection circuitry 54 is used to determine whether access is allowed to one or more of fuses 77 (see decision diamond 308 in FIG. 3). In some embodiments, protection circuitry 54 is also used to determine whether access is allowed to storage circuitry 66. For some embodiments, protection circuitry 54 is used to determine if one or more of a read access, a program access, and/or an override access is allowed. In alternate embodiments, protection circuitry 54 may be used in a variety of ways to protect against unauthorized read accesses to the values programmed in fuses 77, regardless of whether the values of fuses 77 have been stored in storage circuitry 66. Protection circuitry 54 may also be used to limit access to fuses 77 for the purpose of programming fuses 77.

Protection circuitry may also be used in conjunction with override circuitry 56 in order to prevent unauthorized alteration of fuse values which have been stored in storage circuitry 66. Note that override circuitry 56 may additionally be used to selectively enable direct writing of override values from bus 22 into storage circuitry 66. In this manner, software running on data processing system 10 may be used to store override values in storage circuitry 66 which are returned on bus 22 in response to a subsequent read access to fuses 77. Note that the overridden value may also be provided to other circuitry on data processing system 10 (e.g. as direct hardware control signals 80).

Parity circuitry 58 generates parity values based on the sensed value of fuses 77 or the override values stored in storage circuitry 66. These generated parity values are then stored in parity storage circuitry 68. Parity circuitry 58 also checks the parity of values read from storage circuitry 66 and compares this to the parity value stored in parity storage circuitry 68 in order to verify that a parity error has not occurred.

Fuse programming circuitry 60 operates in conjunction with protection circuitry 54 to perform the programming of one or more of fuses 77 when the programming of those fuses 77 has been properly authorized. In one embodiment, fuse programming circuitry 60 receives the address of the fuses 77 to be programmed by way of bus 22.

Fuse sensing circuitry 62 controls and performs the sensing of one or more of fuses 77 when the programming of those fuses 77 has been properly authorized. For one embodiment, fuse sensing circuitry 62 may not be enabled to sense fuses when the selection circuitry 52 has determined that the fuse value is to be provided from storage circuitry 66 to bus 22.

Storage control circuitry 63 may be used to ensure that a sensed fuse value from automatically-stored fuses 70 and on-demand fuses 71 are stored properly in storage circuitry 66.

FIG. 3 illustrates, in flow diagram form, a method for using fuses in accordance with one embodiment of the present invention. The flow 299 starts at start oval 300. The flow 299 then continues to block 302 where reset is asserted. In one embodiment of the present invention, reset within fuse model 20 is asserted by asserting the reset signal which is provided to fuse module 20 as part of bus 22. Alternate embodiments may assert reset in different ways. The flow 299 then proceeds to block 304 where in response to the assertion of reset, one or more automatically-stored fuses 70 (see FIG. 2) may optionally be stored into storage circuitry 66. Alternate embodiments of the present invention may not have automatically-stored fuses 70, or may alternately automatically store the values of fuses 70 into storage circuitry 66 at another predetermined point in time other than reset. Note that for one embodiment, block 304 uses steps 1, 2, and 3 from block 314. Step 4 from block 314 is optional, depending upon whether these automatically-stored fuses 70 have a corresponding portion in selection storage circuitry 64. Step 5 from block 314 is not performed as part of block 304.

From block 304, flow 299 continues to block 306 where a read to one or more of fuses 77 is requested. In one embodiment of the present invention, bus 22 provides address and control signals to fuse module 20 in order to initiate the read access. Alternate embodiments may request a read access in a different manner. The flow 299 then proceeds to decision diamond 308 where the question is asked "does protection circuitry 54 (see FIG. 2) allow read accesses to these fuses?". Note that for one embodiment of the present invention, the address value provided by way of bus 22 is used to determine which of fuses 77 are to be accessed by the current access.

If the answer to decision diamond 308 is no, flow 299 continues to block 310 where access to the desired one or more of fuses 77 is denied and an error condition may optionally be returned. For example, an error flag may be set, an error status signal on bus 22 may be asserted, or any other mechanism may be used to alert the appropriate portion of data processing system 10. In addition, if the read access to fuses 77 is denied, the data returned from the read access may be a random value, a predetermined value, or any other data other than the actual data stored by fuses 77. From block 310, flow 299 returns to block 306.

If the answer to decision diamond 308 is yes, the flow 299 continues to decision diamond 312 where the question is asked "does selection circuitry 52, 64 select the fuses 77 to be read?". If the answer to decision diamond 312 is yes, the flow 299 continues to block 314 where for on-demand-stored fuses and all fuses which had a parity error, the following steps are performed: (1) the fuses 77 which are to be accessed (e.g. the fuses specified by the address of the read access) are sensed; (2) the sensed fuse values are stored into a corresponding storage location in storage circuitry 66; (3) parity values are calculated and stored in a corresponding portion of parity storage circuitry 68; (4) changing corresponding selection storage circuitry 64 to select storage circuitry 66 (not fuses 77) to be read going forward; and (5) data sensed from fuses 77 or data read from storage circuitry 66 (they are now the same) is returned as the read value on bus 22. From block 314, flow 299 returns to block 306.

If the answer to decision diamond 312 is no, the flow 299 continues to block 316 where the portion of storage circuitry 66 which corresponds to the fuses is read. From block 316, flow 299 continues to decision diamond 318 where the question is asked "is there a parity error?". If the answer to decision diamond 312 is yes, the flow 299 continues to block 314, which has been described above, If the answer to decision diamond 312 is no, the flow 299 continues to block 320 where the data read from storage circuitry 66 is returned on bus 22 as the read value. From block 320, flow 299 returns to block 306.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

As one example, fuses 70 (see FIG. 2) may be replaced with any type of non-volatile storage circuitry that may or may not be programmable more than once. For example, fuses 70 may be replaced with EPROM (erasable programmable read only memory), EEPROM (electrically erasable programmable read only memory), or any other type of non-volatile storage circuitry.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for accessing a fuse having corresponding storage circuitry and corresponding selection storage circuitry, comprising:
   requesting a read to the fuse; and
   based on the corresponding selection storage circuitry, selectively sensing the fuse to provide a read value in response to the read request;
   if the corresponding selection storage circuitry has a first value, reading the corresponding storage circuitry to provide the read value in response to the read request; and
   if the corresponding selection storage circuitry has a second value, sensing the fuse to obtain a sensed fuse value, storing the sensed fuse value into the corresponding storage circuitry, and using the sensed fuse value to provide the read value in response to the read request.

2. The method of claim 1, further comprising not sensing the fuse to provide the read value if the corresponding selection storage circuitry has the first value.

3. The method of claim 1, further comprising setting the corresponding selection storage circuitry to the first value after sensing the fuse to obtain the sensed fuse value.

4. The method of claim 1, wherein if the selection storage circuitry has the first value, the method further comprises:
   determining an error value;
   if the error value indicates that an error does not exist, providing data read from the corresponding storage circuitry as the read value; and
   if the error value indicates that an error exists, sensing the fuse to obtain a sensed fuse value, storing the sensed fuse value into the corresponding storage circuitry, and using the sensed fuse value as the read value.

5. The method of claim 4, wherein if the error exists, using the sensed fuse value to provide the read value comprises providing one of the sensed fuse value or the stored sensed fuse value as the read value.

6. The method of claim 1, wherein if the corresponding selection storage circuitry has the second value, using the sensed fuse value to provide the read value comprises providing one of the sensed fuse value or the stored sensed fuse value as the read value.

7. The method of claim 1, further comprising calculating and storing a parity value if the corresponding selection storage circuitry has the second value.

8. The method of claim 1, wherein selectively sensing the fuse to provide the read value in response to the read request is further based on protection circuitry.

9. The method of claim 1, wherein if the corresponding selection storage circuitry has the first value, the read value provided from the corresponding storage circuitry has a same value as the fuse.

10. The method of claim 1, wherein if the corresponding selection storage circuitry has the first value, the read value provided from the corresponding storage circuitry has a different value from the fuse.

11. The method of claim 1, wherein requesting a read to the fuse comprises requesting a read to a plurality of fuses, the corresponding storage circuitry corresponds to the plurality of fuses and the corresponding selection storage circuitry corresponds to the plurality of fuses.

12. The method of claim 11, wherein if the corresponding selection storage circuitry has the second value, sensing the plurality of fuses to obtain the sensed fuse value.

13. The method of claim 11, wherein the plurality of fuses represents a byte of data.

14. An apparatus, comprising:
at least one fuse;
storage circuitry corresponding to the at least one fuse;
selection storage circuitry corresponding to the at least one fuse; and
selection circuitry, coupled to the storage circuitry and selection storage circuitry, which determines, based on a value of the selection storage circuit whether the storage circuit is accessed if the selection storage circuitry has a first value, or, the at least one fuse is sensed if the selection storage circuitry has a second value, to provide a read value in response to a read access to the at least one fuse.

15. The apparatus of claim 14, wherein if the storage circuitry is accessed to provide the read value, the at least one fuse is not sensed.

16. The apparatus of claim 15, wherein if the storage circuitry is accessed to provide the read value, the read value provided from the storage circuitry has a same value as the at least one fuse.

17. The apparatus of claim 15, wherein if the storage circuitry is accessed to provide the read value, the read value provided from the storage circuitry overrides a value of the at least one fuse.

18. The apparatus of claim 14, further comprising protection circuitry coupled to the at least one fuse and the storage circuitry, wherein the protection circuitry determines whether access to the at least one fuse is allowed.

19. The apparatus of claim 18, wherein the protection circuitry determines whether at least one of read access, program access, or override access to the at least one fuse is allowed.

20. The apparatus of claim 14, further comprising control circuitry coupled to the at least one fuse and the storage circuitry, wherein if the at least one fuse is sensed to provide the read value, the control circuitry stores the sensed value into the corresponding storage circuitry.

21. The apparatus of claim 14, wherein the at least one fuse is further characterized as an at least one on-demand-stored fuse whose sensed value is stored to the storage circuitry only in response to read accesses to the fuse.

22. The apparatus of claim 21, further comprising at least one automatically-stored fuse whose sensed value is automatically stored to the storage circuitry in response to at least one of assertion of a reset or a power-up event.

23. The apparatus of claim 14, further comprising control circuitry coupled to the at least one fuse and the storage circuitry, wherein the control circuitry stores a sensed value of the at least one fuse into the corresponding storage circuitry in response to a predetermined event which occurs prior to a read access to the at least one fuse.

24. The apparatus of claim 23, wherein the predetermined event corresponds to at least one of a period of time, a system event, an access of another fuse, an idle cycle on a bus or an external interface, an idle state or interval within a block of logic, a low power state, an access of a predetermined location within a memory or other module, or an interval where sufficient current is available for sensing fuses.

25. The apparatus of claim 14, wherein the at least one fuse comprises a plurality of fuses, wherein each of the storage circuitry and selection storage circuitry corresponds to the plurality of fuses.

26. The apparatus of claim 25, wherein the plurality of fuses represents a byte of data.

27. The apparatus of claim 14, further comprising at least on non-stored fuse, wherein when the at least one non-stored fuse is sensed to provide a sensed value, the sensed value is not stored into any corresponding storage circuitry.

28. An apparatus, comprising:
at least one on-demand-stored fuse;
at least one automatically-stored fuse;
storage circuitry having a first storage location corresponding to the at least one on-demand-stored fuse and a second storage location corresponding to the at least one automatically-stored fuse;
control circuitry, coupled to the at least one on-demand-stored fuse, the at least one automatically-stored fuse, and the storage circuitry, which stores a sensed value of the at least one automatically-stored fuse into the first storage location in response to at least one of a reset or a power-up event and which stores a sensed value of the at least one on-demand-stored fuse into the second storage location only in response to a read request to the at least one on-demand-stored fuse;
selection storage circuitry corresponding to each of the first storage location and second storage location of the storage circuitry; and
selection circuitry, coupled to the storage circuitry and selection storage circuitry, which determines, based on the selection storage circuitry, whether, in response to a read access to one of the at least one on-demand-stored fuse or the at least one automatically-stored fuse, the storage circuitry is accessed or the one of the at least one on-demand-stored fuse or the at least one automatically-stored fuse is sensed to provide a read value in response to the read access.

29. The apparatus of claim 28, wherein if the storage circuitry is accessed to provide the read value, the one of the at least one on-demand-stored fuse or the at least one automatically-stored fuse is not sensed.

30. The apparatus of claim 29, wherein if the storage circuitry is accessed to provide the read value, the read value provided from the storage circuitry has a same value as the one of the at least one on-demand-stored fuse or the at least one automatically-stored fuse.

31. The apparatus of claim 29, wherein if the storage circuitry is accessed to provide the read value, the read value provided from the storage circuitry overrides a value of the one of the at least one on-demand-stored fuse or the at least one automatically-stored fuse.

32. The apparatus of claim 28, wherein the at least one on-demand-stored fuse comprises a plurality of on-demand-stored fuses and the at least one automatically-stored fuse comprises a plurality of automatically-stored fuses, wherein the first storage location corresponds to the plurality of on-demand-stored fuses and the second storage location corresponds to the plurality of automatically-stored fuses, and wherein the selection storage circuitry corresponds to each of the plurality of on-demand-stored fuses and automatically-stored fuses.

33. The apparatus of claim 28, wherein the plurality of on-demand-stored fuses represents a byte of data and the plurality of automatically-stored fuses represents a byte of data.

34. An apparatus, comprising:
at least one on-demand-stored fuse;
at least one automatically-stored fuse;
storage circuitry having a first storage location corresponding to the at least one on-demand-stored fuse and a second storage location corresponding to the at least one automatically-stored fuse;
control circuitry, coupled to the at least one on-demand-stored fuse, the at least one automatically-stored fuse, and the storage circuitry, which stores a sensed value of the at least one automatically-stored fuse into the first storage location in response to at least one of a reset or a power-up event and which stores a sensed value of the at least one on-demand-stored fuse into the second storage location prior to a read request to the at least one on-demand-stored fuse;
selection storage circuitry corresponding to each of the first storage location and second storage location of the storage circuitry; and
selection circuitry, coupled to the storage circuitry and selection storage circuitry, which determines, based on the selection storage circuitry, whether, in response to a read access to one of the at least one on-demand-stored fuse or the at least one automatically-stored fuse, the storage circuitry is accessed or the one of the at least one on-demand-stored fuse or the at least one automatically-stored fuse is sensed to provide a read value in response to the read access.

35. The apparatus of claim 34, wherein the sensed value of the at least one on-demand-stored fuse is stored into the second storage location prior to the read request to the at least one on-demand-stored fuse in response to a predetermined event corresponding to at least one of a period of time, a system event, an access of another fuse, an idle cycle on a bus or an external interface, an idle state or interval within a block of logic, a low power state, an access of a predetermined location within a memory or other module, or an interval where sufficient current is available for sensing fuses.

* * * * *

UNITED STATES PATENT AND TRADEMARK OFFICE
CERTIFICATE OF CORRECTION

PATENT NO.       : 7,362,645 B2
APPLICATION NO.  : 10/955356
DATED            : April 22, 2008
INVENTOR(S)      : Qadeer A. Qureshi Page 1 of 1

It is certified that error appears in the above-identified patent and that said Letters Patent is hereby corrected as shown below:

In Column 9, Line 32, Claim 14,

Change "a value of the selection storage circuit whether the" to --a value of the selection storage circuitry whether the--

Signed and Sealed this

Thirtieth Day of September, 2008

JON W. DUDAS
*Director of the United States Patent and Trademark Office*